United States Patent

Massa et al.

[11] 4,193,039

[45] Mar. 11, 1980

[54] AUTOMATIC ZEROING SYSTEM

[75] Inventors: Richard L. Massa, Sterling Heights; Kenneth J. Cook, Troy, both of Mich.

[73] Assignee: The Valeron Corporation, Oak Park, Mich.

[21] Appl. No.: 876,918

[22] Filed: Feb. 10, 1978

[51] Int. Cl.² .......................................... H03K 13/02
[52] U.S. Cl. ................................. 328/162; 364/571; 340/347 CC; 324/130
[58] Field of Search ................. 364/571; 340/347 CC; 324/130; 328/162; 330/9

[56] References Cited

U.S. PATENT DOCUMENTS

| | | | |
|---|---|---|---|
| 3,495,238 | 2/1970 | Gabriel | 340/347 CC |
| 3,541,320 | 11/1970 | Beall | 330/9 |
| 3,735,273 | 5/1973 | Wright et al. | 328/162 |

Primary Examiner—Malcolm A. Morrison
Assistant Examiner—Gary Chin
Attorney, Agent, or Firm—Krass and Young

[57] ABSTRACT

An electronic apparatus for automatically zeroing or nulling an analog offset voltage by using multiple bit successive approximation to generate an analog zeroing voltage of equal magnitude and opposite polarity to that of the offset voltage, and then summing the zeroing voltage with the offset voltage.

16 Claims, 3 Drawing Figures

AUTOMATIC ZEROING SYSTEM

BACKGROUND OF THE INVENTION

1. Field of the Invention

This invention relates to electronic circuits for automatically zeroing or nulling an analog offset voltage.

2. Description of the Prior Art

In the course of measuring and displaying physical or electrical quantities a variety of electromechanical and electronic devices are commonly used. For example, a method of measuring a physical dimension of a machined part is to use an electromechanical transducer which comes into physical contact with the machined part. The transducer generates an electrical signal corresponding to the physical dimension, and this signal is electronically processed and displayed. However, analog offset voltages are introduced into the system by the normal operation of the electromechanical and electronic devices within the system. These devices include, for example, the electromechanical transducer and operational amplifiers. Therefore, in order to display a correct measurement, it is necessary to manually zero the system to compensate for the analog offset voltage. In addition there are situations where an analog offset voltage is intentionally inserted at the input of a signal processing system, but where it is no longer desirable to retain the offset voltage at the output of the signal processing system. Accordingly, it is desirable to provide an electronic method for automatically zeroing the analog offset voltage.

BRIEF SUMMARY OF THE INVENTION

The principal object of the present invention is to provide an electronic apparatus for automatically zeroing any analog offset voltage present in a signal processing system. This is accomplished by first sensing the polarity of the analog offset voltage, then adding to the offset voltage a zeroing voltage The zeroing voltage initially has a potential of a first predetermined magnitude and a polarity opposite that of the offset voltage. The polarity of the sum of the offset voltage and zeroing voltage is sensed, and if the polarity is different from the polarity of the offset voltage, the first predetermined magnitude is cancelled, and a zeroing voltage having a potential of a second predetermined magnitude is generated. If, however, the polarity of the sum is the same as the polarity of the offset voltage, the potential of the first predetermined magnitude is retained, and the potential of the second predetermined magnitude is added to the zeroing voltage. The value of the second predetermined magnitude is a predetermined fraction of the value of the first predetermined magnitude and of the same polarity as the first predetermined magnitude.

The polarity of the sum is again sensed, and the cycle is repeated a predetermined number of times with a third, a fourth, a fifth and succeeding predetermined magnitudes. Each succeeding predetermined magnitude will always be a predetermined fraction of the previous magnitude and will always have a polarity opposite that of the offset voltage. In the preferred embodiment of the invention, the automatic zeroing circuit utilizes a multiple-bit successive approximation register coupled to an R-2R ladder network to generate the predetermined magnitudes.

A further feature of the invention is a provision for indication of an overrange condition at which point the automatic zeroing circuit can no longer zero the offset signal. Still another feature is a provision for a "zero boost" to prevent indecision of a display between 0 and −1. This indecision occurs in digital displays in which the numeral 0 is considered to be a positive rather than a signless number. Many additional features and advantages of the invention including the adaptability of the subject device to more sophisticated data processing and/or display functions will be apparent from a reading of the specification in which an illustrative embodiment of the invention is described in detail. This specification is to be taken with the accompanying drawings in which the various electronic and functional characteristics of the preferred embodiment are illustrated.

DETAILED DESCRIPTION OF THE DRAWINGS

In the following detailed description certain specific terminology is utilized for the sake of clarity. "Offset signal" refers to an undesirable d.c. level that has no meaningful significance to the desired output signal. "Transducer signal" refers to a transducer output signal corresponding to the measurement of a desired parameter. "Zeroing signal" refers to that voltage generated by the automatic zeroing circuit, and "output signal" refers to that voltage which is the sum of the transducer signal, the zeroing signal and the offset signal. The output signal can be displayed by a suitable display device or used to perform a control function. "Polarity signal" refers to the instantaneous polarity of the sum of the transducer signal, the zeroing signal and the offset signal. The polarity signal can also be displayed or used to perform an external control function.

Figure 1:
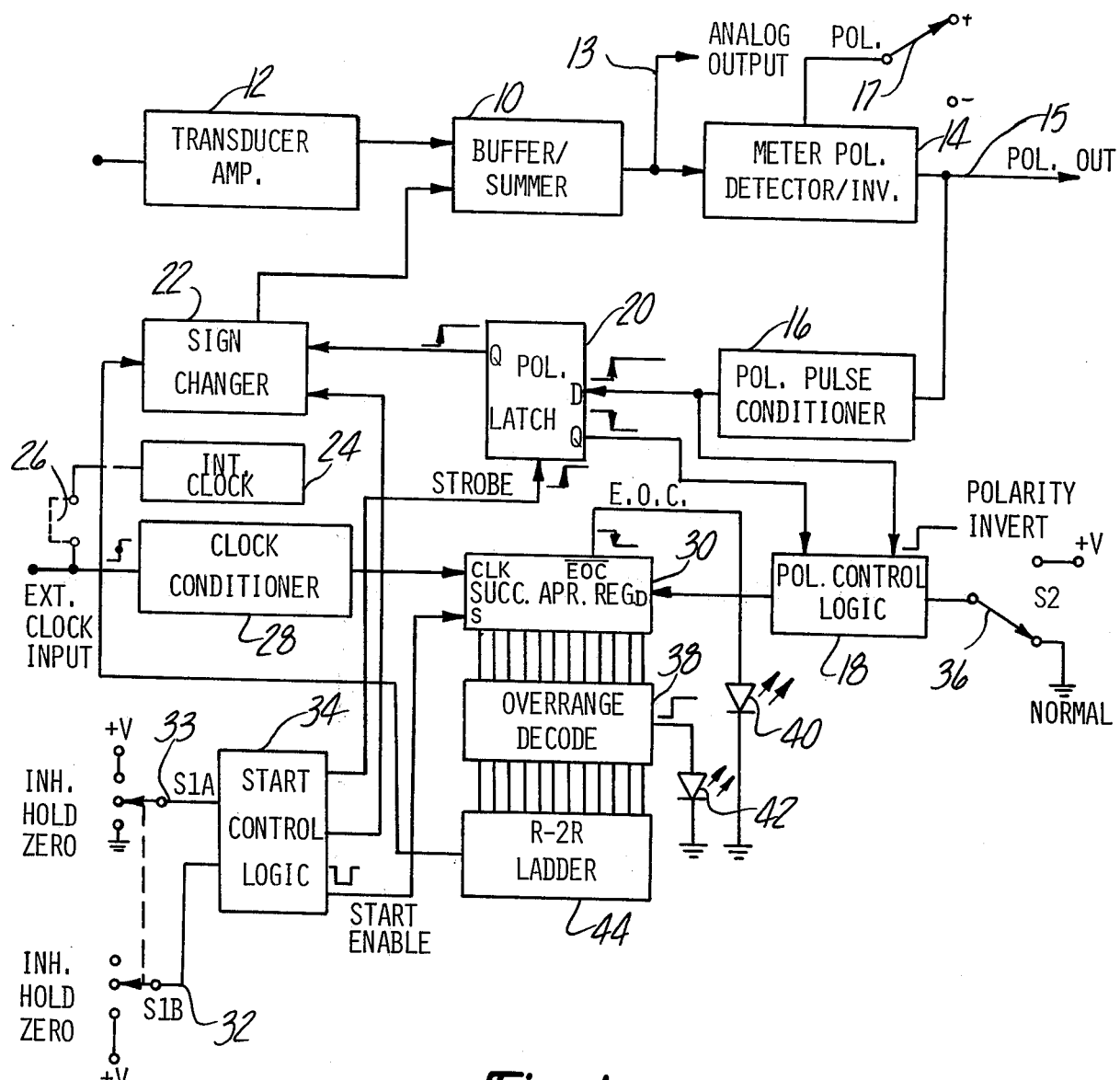
FIG. 1 is a block diagram of the automatic zero circuit.

FIG. 1 shows a buffer/summer 10, placed in series between a transducer amplifier 12 and a meter polarity detector/inverter 14. The transducer amplifier 12 and meter polarity detector/inverter 14 are included in the preferred embodiment for the sake of clarity. However, they may already exist as part of an external signal processing system, in which case duplication of the units is unnecessary. The buffer/summer output is also connected to analog output line 13. The output of the meter polarity detector/inverter 14 is applied to both polarity output line 15 and to the input of polarity pulse conditioner 16, while the output of the polarity pulse conditioner 16 is connected to polarity control logic 18 and a polarity latch 20. Polarity selector switch 17 is connected to meter polarity detector/inverter 14. The polarity latch output is connected to a sign changer 22 and the polarity control logic 18. An internal clock 24 is connected through a jumper 26 to a clock conditioner 28 with said clock conditioner connected to a multiple-bit successive approximation register 30. Switches 32 and 33 are connected to the start control logic 34, and the start control logic 34 is connected to the polarity latch 20, the sign changer 22 and the successive approximation register 30. Switches 32 and 33 are mechanically ganged. The polarity control logic 18 is further connected to the successive approximation register 30 and a polarity invert switch 36. The successive approximation register is further connected to an overrange decoder 38, an R-2R ladder network 44, and to an end of conversion LED 40. The overrange decoder is connected to an overrange LED 42. The R-2R ladder 44 is further connected to the sign changer 22.

In operation when function switches 32 and 33 are momentarily held in the "zero" position start control logic 34 is enabled. Start control logic 34 activates polarity latch 20, sign changer 22, and successive approximation register 30. Polarity pulse conditioner 16 senses the polarity of the output signal and sets the polarity latch 20.

Figure 3:
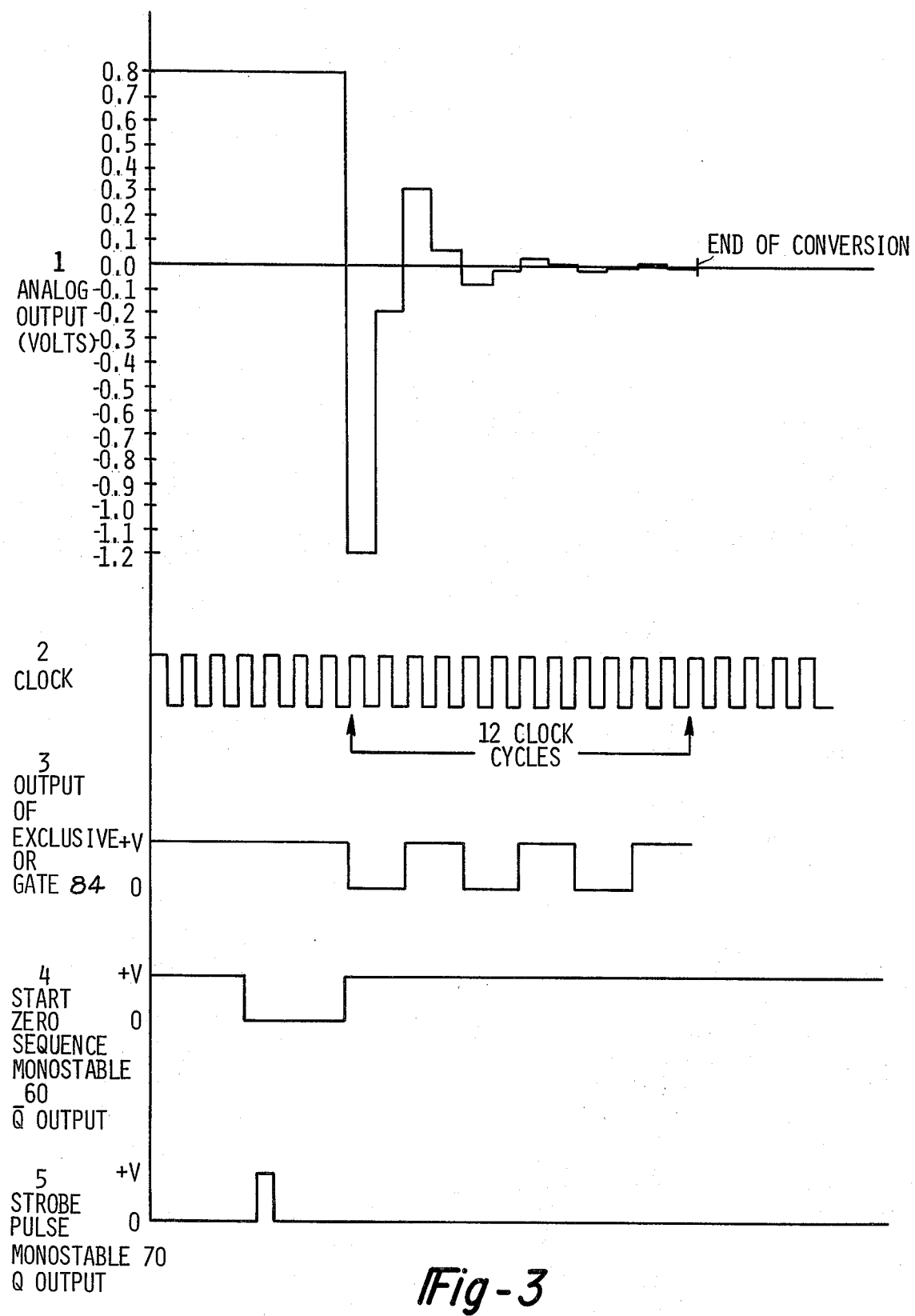
FIG. 3 depicts the operation of the automatic zero circuit as a function of time.

As displayed in FIG. 3, once initiated, successive approximation register 30 operates for a predetermined number of cycles, being controlled by the internal clock 24 or an external timing device properly conditioned by the clock conditioner 28. FIG. 3 depicts a timing diagram for a specific embodiment in which the successive approximation register 30 of FIG. 1 operates for 12 clock cycles to null the offset signal by making a given number of changes of predetermined magnitude in the zeroing voltage, each change being onehalf of the previous change. Each particular change of predetermined magnitude is retained if the instantaneous polarity of the output signal is the same as the polarity of the offset signal, or cancelled if the two polarities are different. The polarity latch 20 operates in conjunction with the sign changer 22 to insure that the polarity of the zeroing signal is opposite that of the offset signal.

At the end of this operation the end-of-conversion LED 40 is energized indicating that the zeroing cycle is complete. With the function switch 34 now in the HOLD position, the buffer/summer 10 algebraically sums the zeroing signal with offset signal and the transducer signal from the transducer amplifier to thereby produce the output signal that is to be displayed or used to perform a control function. The overrange LED 42 indicates a condition where the automatic zero circuit can no longer zero the reference signal.

Figure 2:
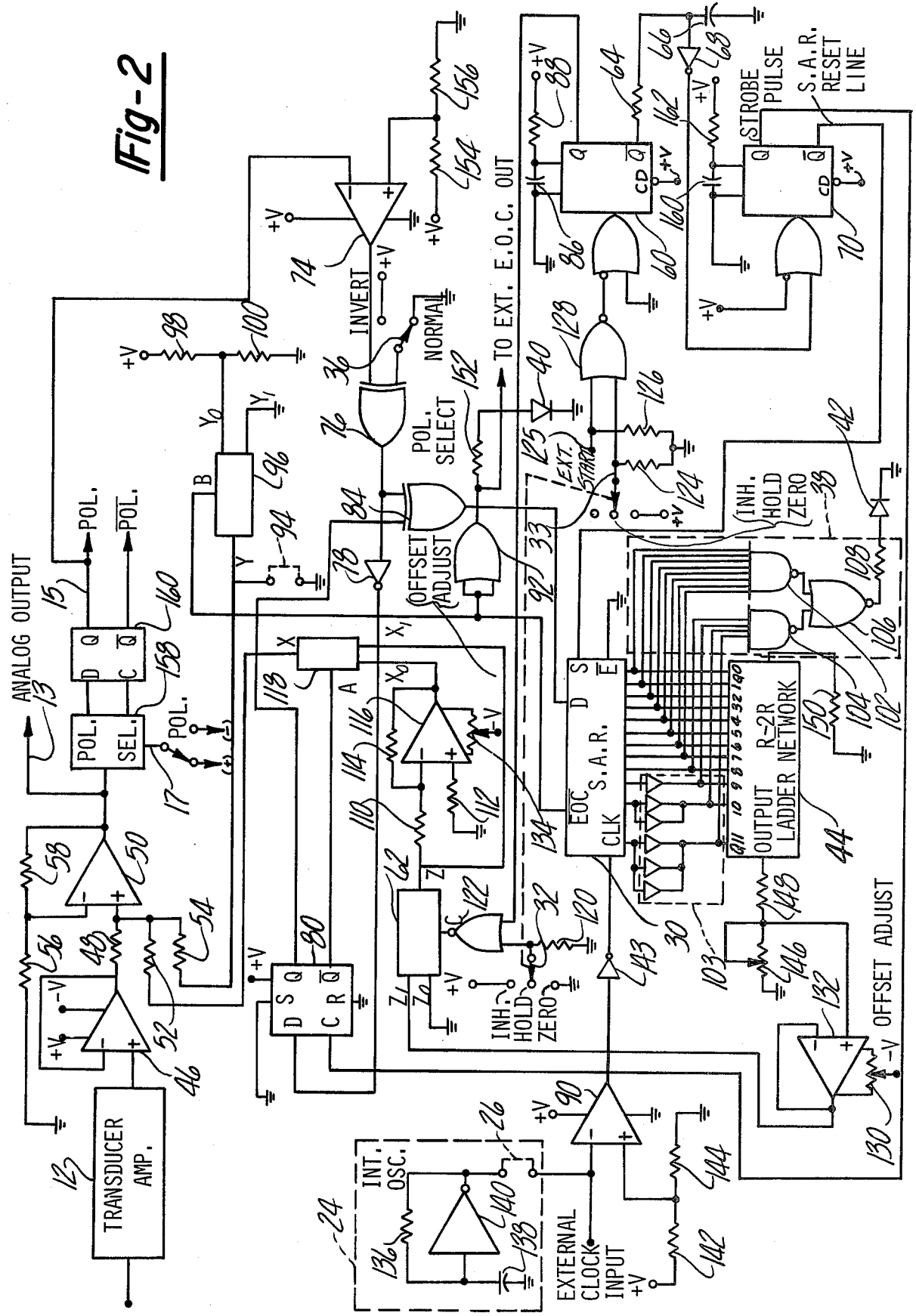
FIG. 2 is a more detailed version of FIG. 1.

Referring to FIG. 2 the automatic zero circuit is described in greater detail.

Transducer amplifier 12 is connected between the output of an external transducer and the positive input of buffer amplifier 46. The output of buffer amplifier 46 is connected both to the negative input of amplifier 46 and the positive input of summing amplifier 50 through resistor 48. Resistor 52 is connected between the positive input of summing amplifier 50 and output X of analog switch 118. Resistor 54 is connected between the positive input of summing amplifier 50 and the output of analog switch 96.

The output of summing amplifier 50 is connected to both one side of resistor 58, analog output line 13 and the input of polarity selector 158. The other side of resistor 58 is connected to the junction of resistor 56 and the negative input of summing amplifier 50. The other side of resistor 56 is connected to ground.

Polarity selector 158 and flip-flop 160 are typically a part of the display apparatus to be automatically zeroed in accordance with the principles of this invention. Basically, the polarity selector 158—flip-flop 160 combination is an analog-to-digital conversion device that examines a signal derived from the display transducer output and produces a binary signal whose state represents the polarity of the transducer analog output. POL switch 17 is shown to represent that type of display device in which the conventional plus or minus polarity designations may be reversed. Such an option is desirable, for example, in machine tool part size control systems wherein the out-of-size indication sense must be reversed when measuring the inside diameter of a workpiece, as opposed to measuring the outside diameter of the workpiece.

One specific known example of the internal structure and function of block 158 of FIG. 2 is set forth in U.S. Pat. No. 4,038,756, which is assigned to the same assignee as the instant invention. The elements of FIG. 1 of the reference patent that would be included in block 158 of FIG. 2 of the instant invention are: resistor 36, capacitor 34, sampling gate 38, capacitor 42, monopulser 40, frequency divider 24, phase locked loop 22, master oscillator 20, and comparators 48 and 50, whose outputs would be coupled to the D and C inputs of flip-flop 160 of the instant invention. Hence, it is apparent that flip-flop 74 of FIG. 1 of the referenced patent corresponds to flip-flop 160 of FIG. 2 of the instant invention.

It would be a simple matter for one of ordinary electronics skill to provide suitable gating logic to switch the outputs of comparators 48 and 50 of the reference patent in accordance with the selected position of POL switch 17 of FIG. 2 of the instant invention.

Polarity selector 158 is connected to polarity switch 17 and also has outputs respectively connected to the C and D inputs of flip-flop 160. The Q output of flip-flop 160 is connected to the inverting input of comparator 74 and to polarity output line 15. The non-inverting input of comparator 74 is connected to the junction of resistors 154 and 156. The opposite side of resistor 154 is connected to an external power supply +V and the opposite side of resistor 156 is connected to ground. Appropriate power supply terminals of comparator 74 are respectively connected to ground and external power supply +V. The output of comparator 74 is connected to one input of exclusive OR-gate 76. The other input of gate 76 is connected to the center contact of switch 36. The upper and lower terminals of switch 36 are connected to external power supply +V and ground, respectively.

The output of gate 76 is connected to both the input of inverter 78 and one input of exclusive OR-gate 84. The other input of exclusive OR-gate 84 is connected to the Q output of flip-flop 80. The output of gate 84 is connected to the D input of successive approximation register 30. The end-of-conversion output, EOC, of register 30 is connected to inverter 92 and to the control input B of analog switch 96. Inverter 92 is comprised of an OR gate having both inputs coupled together. The output of inverter 92 connected to light emitting diode (LED) 40 through resistor 152. The opposite end of LED 40 is connected to ground. The output of inverter 78 is connected to the D input of flip-flop 80. The $\overline{Q}$ output of flip-flop 80 is connected to control input A of analog switch 118. Flip-flop 80 also has its S and R terminals connected to ground.

Capacitor 138 is connected between ground and the junction of the input of inverter 140 and one terminal of resistor 136. The output of inverter 140 is connected to the other terminal of resistor 136 and to jumper 26. The other side of jumper 26 is connected to the inverting input of comparator 90. The non-inverting input of comparator 90 is connected to junction of resistors 142 and 144. The other terminal of resistor 142 is connected to external power supply +V and the opposite terminal of resistor 144 is connected to ground. Appropriate power supply terminals of comparator 90 are respectively connected to ground and external power supply. The output of 90 is connected to the input of inverter 143. The output of inverter 143 is connected to the clock input, CLK, of successive approximation register 30.

One input of NOR-gate 122 is connected to the junction of resistor 120 and one center contact of switch 32. The upper contact of switch 32 is connected to external power supply +V while the lower contact of switch 32 is connected to ground. The opposite side of resistor 120 is also connected to ground. The other input of NOR-gate 122 is connected to the Q output of monostable device 60. The output of gate 122 is connected to control input C of analog switch 62.

The output of R-2R ladder network 44 is connected to one terminal of resistor 148. Resistor 150 is connected between the R-2R ladder network 44 and ground. The other terminal of resistor 148 is connected to the junction of variable resistor 146 and the non-inverting input of amplifier 132. The opposite terminal of resistor 146 is connected to ground. The inverting input of amplifier 132 is connected to its output, and both ends of potentiometer 130 are connected to appropriate biasing input terminals of amplifier 132. The center arm of potentiometer 130 is connected to external negative power supply −V. The output of amplifier 130 is also connected to the $Z_1$ input of analog switch 62. The $Z_0$ input of analog switch 62 is connected to ground and the output Z of analog switch 62 is is connected to the junction of resistor 110 and the $X_1$ input of analog switch 118. The opposite terminal of resistor 110 is connected to the junction of resistor 114 and the inverting input of amplifier 116. Resistor 112 is connected between ground and the non-inverting input of amplifier 116. Both ends of potentiometer 134 are connected to appropriate biasing input terminals of amplifier 116. The center arm of potentiometer 134 is connected to external negative power supply −V.

The $Y_0$ input of analog switch 96 is connected to the junction of resistor 98 and resistor 100. The other terminal of resistor 98 is connected to external positive power supply +V, and the other side of resistor 100 is connected to ground. The $Y_1$ input of analog switch 96 is connected to ground, and the output, Y, of analog switch 96 is connected to the junction of resistor 54 and optional jumper 94.

The $C_D$ terminal of monostable device 60 is connected to external positive power supply +V. Appropriate inputs of monostable device 60 are also connected to a timing network comprising capacitor 86 and resistor 88. One input of monostable device 60 is connected to the output of NOR-gate 128, and the other input is connected to ground. The Q output of monostable device 60 is connected to one input of NOR-gate 122 and the $\overline{Q}$ output of monostable device 60 is connected to one terminal of resistor 64.

The other terminal of resistor 64 is connected to the junction of the input of inverter 68 and one terminal of capacitor 66. The other terminal of capacitor 66 is connected to ground.

The $C_D$ terminal of monostable device 70 is connected to external positive power supply +V. Appropriate inputs of monostable device 70 are connected to a timing network comprised of capacitor 160 and resistor 162. One input of monostable device 60 is connected to external positive power supply and the other input is connected to the output of inverter 68. The Q output of monostable device 70 is connected to the clock input, C, of flip-flop 80, and the $\overline{Q}$ output is connected to the S input of register 30.

The timing network comprising capacitor 160 and resistor 162 is also appropriately coupled, as above, to ground and positive supply +V.

Switch 33 has its center contact connected to the junction of one input of NOR-gate 128 and resistor 124. The other input of NOR-gate 128 is connected to the junction of external start terminal 125 and resistor 126. The other terminal of each of resistors 124 and 126 is connected to ground. The upper contact to switch 33 is open and the lower contact is connected to external postive power supply +V.

The three most significant inputs Q9, Q10, Q11 of successive approximation register 30 are connected to outputs of buffer/driver 103. The three outputs of buffer/driver 103 are also connected to three inputs of NAND gate 104. Another output line of register 30 is connected to the junction of a fourth input of NAND-gate 104 and the Q8 input of R-2R ladder network 44. The remaining output lines of register 30 are connected to the junctions of the inputs of NAND-gate 102 and the remaining inputs, Q7 through Q0, of R-2R ladder network 44.

The outputs of gates 104 and 102 are connected to inputs of NOR-gate 106. The output of NOR-gate 106 is connected to LED 42 through resistor 108. The other terminal of LED 42 is connected to ground.

Referring to FIG. 2 and FIG. 3 the specific method of operation of the automatic zeroing circuit is described in detail. It is to be understood that the specific voltage levels and the number of cycles are chosen for purposes of explanation and may be changed to accommodate specific applications. For purposes of explanation assume that an offset voltage having a potential of +0.800 volts is present in the output signal at analog output line 13. Also assume that the transducer signal has a potential of 0.00 volts, and that the potential of a reference power supply applied to the register 30 is +7.5 volts. Therefore, the output voltage initially consists solely of the offset voltage. The internal clock 24 operates as depicted in line 2 of FIG. 3.

With reference to FIG. 2, when the function switch, comprised of ganged switch sections 32 and 33, is momentarily held in the ZERO position, monopulser 60 is enabled via NOR gate 128 to force its Q output to the logic high state for approximately 220 msec. During this period, logic high at the Q output of monopulser 60 is inverted by NOR gate 122, thereby causing analog switch 62 to couple zero, or ground, potential at input $Z_0$ to output Z, this zero level is further coupled via analog switch 118 to summing amplifier 50 via input resistor 52. Zero potential at input $Y_1$ to analog switch 96 is coupled, at this time, to switch output Y, due to the presence of a logic high condition at output EOC of register 30. Output Y of switch 96 is, in turn, coupled to summing amplifier 50 via input resistor 54. This sequence of operation allows the polarity of the signal present at the output of amplifier 46, to be determined without any interaction with a residual zeroing voltage developed by the preceding zeroing cycle of the apparatus of the invention.

The falling edge of the Q output of monopulser 60 is delayed by the combination of resistor 64 and capacitor 66, inverted by inverter 68, and coupled to a triggering input of monopulser 70. The delayed triggering of monopulser 70 assures that analog switch 62 has sufficient time to couple its $Z_0$ input to its output, as described above, thereby making the state of polarity line 15 dependent only upon the polarity of the offset signal present at the non-inverting input to amplifier 46.

Upon delayed triggering of monopulser 70, its Q output goes high for a period determined by capacitor 160 and resistor 162. This logic high state, as shown at line 5 of FIG. 3, forces D flip-flop 80 to latch the logic level representation of the polarity of the offset signal presented to the D input of flip-flop 80. This polarity information is used throughout the zeroing cycle, described below, by exclusive—OR gate 84 to control the multiple-bit successive approximation register (SAR) 30. Also at this time, the $\overline{Q}$ output of monopulser 70 goes low to reset SAR 30 in preparation for the zeroing process.

Initially polarity output line 15 has its state determined solely by the polarity of the sum of the offset signal and the transducer signal, since the offset and transducer signals are passed through summing amplifier 50 unchanged. Since it has been assumed that the potential of the transducer signal is 0.00, the polarity output line 15 has its state determined solely by the polarity of the offset signal. The polarity output line 15 always has one of two states, either HIGH or LOW. The state of polarity line 15 controls the output of exclusive OR-gate 76.

One input of exclusive OR-gate 84 senses the state of flip-flop 80, which is latched by the polarity of the offset signal, and the other input of gate 84 senses the state of polarity output line 15 through exclusive OR-gate 76. The state of polarity output line 15 is controlled by the polarity of the output signal. Gate 84 senses in this example that the stored polarity and the output signal polarity are the same. It is important to note that polarity information at the input to flip-flop 80 is inverted by inverter 78.

Therefore, with polarity selector switch 36 in the "NORMAL" position, the output of gate 84 is now in the HIGH state as depicted in line 3 of FIG. 3. The output of gate 84 causes the successive approximation register 30 to produce a high state having a preselected potential of +7.50 volts in its most significant output line thereby causing the R-2R network 44 to produce zeroing signal having a potential of +3.75 volts. This signal is scaled to +2.00 volts by a voltage divider consisting of resistors 146 and 148 and is buffered by a unity gain non-inverting amplifier 132. This scaled signal is coupled via analog switch 62 to amplifier 116 and inverted therein to produce a zeroing signal at enabled input $X_0$ of analog switch 118 which is added to the offset signal at amplifier 50 to produce an output potential of −1.20 volts.

Upon sensing that the stored polarity, that is the polarity of the offset signal, and the output signal polarity are different the output of gate 84 is now in the LOW state as shown in line 3 of FIG. 3. Since the output of gate 84 is in the LOW state, register 30 cancels the HIGH state on the most significant output line. During the next clock pulse, register 30 produces a HIGH state having a potential of +7.50 volts in the second most significant output line thereby causing the R-2R ladder network 44 to produce a signal having a potential of +1.875 volts. This signal is scaled to +1.00 volts by resistors 146 and 148. This scaled signal is inverted by inverting amplifier 116 to produce a zeroing signal which is added to the offset signal at amplifier 50 to produce an output potential of −0.200 volts. As before, upon sensing via gate 84 that the stored polarity and the output signal polarity are different, SAR 30 cancels the HIGH state on the second most significant output line.

Continuing with the same sequence during the next clock pulse the circuit produces a zeroing signal of −0.500 volts which is added to the offset signal. The output signal thus becomes +0.300 volts. Since the polarity of the output signal is the same as the polarity of the offset signal, the output of exclusive OR-gate 84 becomes HIGH thereby causing register 30 to retain the third most significant bit in the logic HIGH state.

During the next clock pulse, the register 30 produces a HIGH state in its fourth most significant output line, thereby causing the R-2R ladder network to increase its output potential such that the potential of the zeroing signal is decreased by −0.250 volts to −0.750 volts. In this specific example the zeroing voltage changes in steps of a predetermined magnitude such that each succeeding step is equal to one-half of the previous step. The fraction is selected to be one-half since the technique of multiple-bit successive approximation is most efficient with that fraction.

The output voltage is now +0.05 volts, meaning that the polarity of the output signal and the offset signal are the same. The register 30 is thus instructed to retain the fourth most significant output line in the HIGH state.

Continuing with the same sequence the fifth step adds −0.125 volts to the potential of the zeroing signal. Since this causes the output signal polarity to be different from the polarity of the offset signal, that step is cancelled. The sixth step adds −0.063 volts and this step is cancelled.

The seventh step adds −0.031 volts and the eighth step adds −0.016 volts. The seventh step is retained since the output signal polarity is still the same as the offset signal polarity. The eighth step is retained for the same reason.

The ninth step adds −0.008 volts and the tenth step adds −0.004 volts to the zeroing signal potential. Both the ninth and tenth steps are cancelled.

The eleventh step will add −0.002 volts to the zeroing signal thereby making the potential of the zeroing signal −0.799. The twelfth step will add −0.001 volts to the zeroing signal, thus making the potential of the zeroing signal −0.800. The potential of the sum of the zeroing signal and the offset signal therefore becomes 0.000.

The HIGH state of each output line of successive approximation register 30 has a potential of +7.50 volts. As previously described, the R-2R ladder network 44 produces incremental changes in its output, depending upon the state of each output line of register 30.

To summarize, when an offset signal having a potential of +0.8 volts is to be zeroed, the various parameters as a function of clock pulses are:

| Clock Pulse | Approximate Incremental Change (Volts) | Zeroing Signal (Volts) | Output Signal (Volts) | Retained Change |
|---|---|---|---|---|
| 1 | −2.000 | −2.000 | −1.200 | no |
| 2 | −1.000 | −1.000 | −0.200 | no |
| 3 | −0.500 | −0.500 | +0.300 | yes |
| 4 | −0.250 | −0.750 | +0.050 | yes |
| 5 | −0.125 | −0.875 | −0.075 | no |
| 6 | −0.063 | −0.813 | −0.013 | no |
| 7 | −0.031 | −0.781 | +0.019 | yes |
| 8 | −0.016 | −0.797 | +0.003 | yes |
| 9 | −0.008 | −0.805 | −0.005 | no |
| 10 | −0.004 | −0.801 | −0.001 | no |
| 11 | −0.002 | −0.799 | +0.001 | yes |

-continued

| Clock Pulse | Approximate Incremental Change (Volts) | Zeroing Signal (Volts) | Output Signal (Volts) | Retained Change |
|---|---|---|---|---|
| 12 | −0.001 | −0.800 | 0.000 | yes |

At the end of 12 cycles the output voltage is zero or as close thereto as possible with the given number of clock cycles. In addition at the end of the predetermined number of cycles, in this case 12, the end-of-conversion output of register 30 switches to the LOW state. The end-of-conversion output is inverted by NOR gate 92 and thereby turns on LED 40 to indicate that the zeroing cycle has been completed.

To permit use of the automatic zeroing circuit with systems using negative logic, polarity invert switch 36 allows the circuit logic to be inverted. Whenever the normal position of switch 36 is inverted, the position of polarity selector switch 17 must also be inverted to insure proper operation.

When switch 36 is in the normal position, the automatic zeroing circuit will function properly with a positive logic polarity signal, that is, the state of the polarity output line 15 is HIGH for a positive polarity output signal and is LOW for a negative polarity output signal.

As discussed previously, switch 17 may not be present in some instances since the polarity selector 158 may be a sort of a pre-existing circuit which is external to the remainder of the automatic zeroing circuit. In those situations where switch 17 is not present, switch 36 is placed in the invert position if the apparatus to which the automatic zeroing circuit uses negative logic, that is, the state of the polarity output line 15 is HIGH for a negative polarity output signal, and is LOW for a positive polarity output signal.

For use with displays which do not provide both a "+" and "−" zero indication, in order to eliminate display indecision the automatic zero circuit provides a d.c. bias voltage which is summed with the transducer signal and zeroing signal. The voltage divider consisting of resistors 98 and 100 provides d.c. signal which is applied to summing amplifier 50 at the end of the zeroing cycle via analog switch 96 being enabled by the EOC signal from SAR 30. In this specific embodiment the potential of the d.c. signal is set at 80 millivolts in order to be compatible with a specific display device. However, by changing the relative values of resistors 98 and 100 the potential may be changed to accommodate the requirements of other types of display devices. Strapping option 94 is wired to clamp the output of analog switch 96 to ground, or zero, potential whenever the above-described function of zero level boosting is not required for the particular display device being automatically zeroed in accordance with the principles of this invention.

To indicate an overrange condition at which point the automatic zeroing circuit can no longer zero the reference signal, the 12 digit output lines of register 30 are connected to NAND-gates 102 and 104. These gates provide a LOW state output when all outputs of register 30 are in the HIGH state. The outputs of gates 102 and 104 are connected to the inputs of NOR-gate 106. Thus, when all outputs of register 30 are in the HIGH state, gate 106 provides a HIGH state output to thereby drive overrange LED 42.

Potentiometer 130 and potentiometer 134 control the offset voltage in the outputs of amplifier 132 and amplifier 116 respectively. These potentiometers are typically adjusted such that amplifiers 132 and 116 add no offset voltages of their own. However, since the automatic zeroing circuit compensates for any offset voltages within its range, the adjustment of potentiometers 130 and 134 is not critical.

To assist the practitioner in constructing the preferred embodiment of the invention the following part values or identification numbers are listed. The values given for resistors 98 and 100 are for a positive power supply potential of +7.5 volts, and all resistors are rated at 0.25 watt nominal.

| Reference Number | Type | Value or Identification Number |
|---|---|---|
| 30 | Integrated Circuit | National 74C905 |
| 103 | Integrated Circuit | National 74C902 |
| 74 | Integrated Circuit | RCA CA3130S |
| 90 | Integrated Circuit | RCA CA3130S |
| 46 | Integrated Circuit | Motorola MC1741CP |
| 50 | Integrated Circuit | Motorola MC1741CP |
| 116 | Integrated Circuit | Motorola MC1741CP |
| 102 | Integrated Circuit | Motorola MC14068B |
| 104 | Integrated Circuit | Motorola MC14012B |
| 80 | Integrated Circuit | Motorola MC14013B |
| 76,84 | Integrated Circuit | Motorola MC14070B |
| 60,70 | Integrated Circuit | Motorola MC14538B |
| 62,96,118 92,106,122 | Integrated Circuit | Motorola MC14053B |
| 128 | Integrated Circuit | Motorola MC14001B |
| 68,78,140 143 | Integrated Circuit | Motorola MC14584B |
| 48 | Resistor | 100K ohms ± 1% |
| 52 | Resistor | 100K ohms ± 1% |
| 54 | Resistor | 100K ohms ± 1% |
| 56 | Resistor | 100K ohms ± 1% |
| 58 | Resistor | 100K ohms ± 1% |
| 64 | Resistor | 1 MEG ohms ± 5% |
| 88 | Resistor | 470K ohms ± 5% |
| 98 | Resistor | 10K ohms ± 1% |
| 100 | Resistor | 108 ohms ± 1% |
| 108 | Resistor | 470 ohms ± 5% |
| 110 | Resistor | 50K ohms ± 1% |
| 112 | Resistor | 25K ohms ± 1% |
| 114 | Resistor | 50K ohms ± 1% |
| 120 | Resistor | 120K ohms ± 5% |
| 124 | Resistor | 100K ohms ± 5% |
| 126 | Resistor | 100K ohms ± 5% |
| 136 | Resistor | 330K ohms ± 5% |
| 142 | Resistor | 47K ohms ± 5% |
| 144 | Resistor | 3.3K ohms ± 5% |
| 146 | Resistor | 1 MEG ohms ± 5% |
| 148 | Resistor | 750K ohms ± 5% |
| 150 | Resistor | 100K ohms ± 5% |
| 152 | Resistor | 470 ohms ± 5% |
| 154 | Resistor | 47K ohms ± 5% |
| 156 | Resistor | 3.3K ohms ± 5% |
| 162 | Resistor | 560K ohms ± 5% |
| 86 | Capacitor | 0.47 mf |
| 138 | Capacitor | 0.15 mf |
| 160 | Capacitor | 0.47 mf |

It is to be understood that the subject invention has been described by reference to specific embodiments and that many additions and modifications thereto will be apparent to those skilled in the art. Accordingly, the foregoing description is not to be construed in a limiting sense.

The embodiments of the invention in which an exclusive property or privilege is claimed are defined as follows:

1. Apparatus for automatically producing an analog zeroing voltage for nulling an offset voltage of either positive or negative polarity, said apparatus comprising:
   polarity sensing means for sensing the polarity of a signal associated with the offset signal;

latch means coupled to the sensing means for providing a control signal whose state depends upon the polarity of the offset signal as determined by the sensing means;

voltage generator means for producing an output voltage of a magnitude substantially the same as the offset voltage;

inverter means for inverting the output voltage from the voltage generator;

switch means having two inputs, a control input and an output, one input being coupled to the unchanged output of the voltage generator means, with the other input being coupled to the output of the inverter means, and the control input being coupled to the output of said latch means, operative to couple one of its inputs to its output depending on the state of the control signal from the latch means whereby a zeroing voltage is provided of the same magnitude yet of opposite polarity to that of the offset voltage; and summing means coupled to the output of said switch means for summing the zeroing voltage with the offset voltage.

2. Apparatus as defined in claim 1 wherein said voltage generator means further comprises:

means for making a plurality of changes in the magnitude of the analog zeroing signal, each change being a fraction of the previous change, and each change being selected to drive the sum of the analog zeroing signal and the analog offset signal toward zero from one direction.

3. Apparatus as defined in claim 2 wherein said voltage generator means further comprises:

cycle actuating means;

oscillating means; and, a multiple-bit successive approximation register connected to said cycle actuating means and said oscillating means.

4. Apparatus as defined in claim 3 wherein said cycle actuating means consists of a toggle switch or a remote contact closure.

5. Apparatus as defined in claim 3 wherein said oscillating means further comprises:

an electronic oscillator.

6. Apparatus as defined in claim 1 wherein said polarity sensing means comprises:

a comparator connected to an exclusive OR-gate.

7. Apparatus as defined in claim 1 wherein said latch means comprises:

an electronic flip-flop.

8. Apparatus as defined in claim 1 wherein said inverter means further comprises:

a unity gain inverter having an input and output, with said one input of said switch means being connected to the input of said inverter and the other input of said switch means connected to the output of said inverter.

9. Apparatus as defined in claim 1 wherein said summing means further comprises:

a unity gain summing amplifier.

10. Apparatus as defined in claim 9 wherein said summing amplifier further comprises:

an operational amplifier; and three resistors each having one end connected to the input of said operational amplifier.

11. Apparatus as recited in claim 1 further comprising:

means coupled to said summing means for preventing indecision of a display device, operative to supply a predetermined voltage level to said summing means after generation of the zeroing signal.

12. Apparatus as defined in claim 11 wherein said means for preventing indecision of a display device further comprises:

a voltage source coupled to a resistive voltage dividing means; and electronic analog switch means connecting said resistive voltage dividing means with said summing means, said electronic analog switch means having a control input coupled to said voltage generator means, operative to connect the output of the resistive voltage dividing means to said summing means after the generation of said zeroing voltage.

13. Apparatus as defined in claim 3 which further comprises:

means for indicating an overrange condition of said multiple-bit successive approximation register.

14. Apparatus as defined in claim 13 wherein said means for indicating an overrange condition further comprises:

a first NAND-gate having its inputs connected to some of a plurality of outputs of said multiple-bit successive approximation register;

a second NAND-gate having its inputs connected to the remaining outputs of said multiple-bit successive approximation register;

a NOR-gate having an output and two inputs, one input connected to the output of said first NAND-gate and the other input connected to the output of said second NAND-gate; and a light emitting diode connected to the output of said NOR-gate.

15. Apparatus as defined in claim 3 which further comprises:

comparison means having two inputs and an output, one input being coupled to the output of said sensing means, the other input coupled to an output of the latch means, and the output coupled to a control input of the successive approximation register, operative to control the magnitude of the zeroing voltage generated by the register as a function of the comparison of the signals at its two inputs.

16. Apparatus as defined in claim 15 wherein said register includes a plurality of output lines, with said apparatus further comprising:

resistive means coupled to the output lines of the register, operative to provide sequentially decreasing output voltages depending on the state of the signals on the output lines from the register; and said comparison means controlling the ultimate states of the signals on the output lines from the register wherein selected output voltages from the resistive means are utilized to form the final zeroing signal of a magnitude approximating the offset signal.

* * * * *